United States Patent [19]

Otani et al.

[11] Patent Number: 5,199,830
[45] Date of Patent: Apr. 6, 1993

[54] PRINTED CIRCUIT BOARD PRESSER DEVICE IN DRILLING MACHINE

[75] Inventors: Tamio Otani, Hadano; Kazuhiro Kogure, Kawasaki; Kunio Arai, Atsugi; Yasuhiko Kanaya, Machida; Kazunori Hamada, Inagi, all of Japan

[73] Assignee: Hitachi Seiko Ltd., Ebina, Japan

[21] Appl. No.: 741,427

[22] PCT Filed: Nov. 30, 1990

[86] PCT No.: PCT/JP90/01559
§ 371 Date: Aug. 1, 1991
§ 102(e) Date: Aug. 1, 1991

[87] PCT Pub. No.: WO91/08073
PCT Pub. Date: Jun. 13, 1991

[30] Foreign Application Priority Data
Dec. 1, 1989 [JP] Japan .................. 1-310654

[51] Int. Cl.⁵ ............................................. B23B 47/34
[52] U.S. Cl. ........................................ 408/67; 408/95; 408/98; 409/137
[58] Field of Search ............... 409/137, 163, 189, 190; 408/95, 98, 58, 67, 51

[56] References Cited

U.S. PATENT DOCUMENTS

| | | | |
|---|---|---|---|
| 3,617,141 | 11/1971 | Sullivan | 408/35 |
| 4,037,982 | 7/1977 | Clement | 409/137 X |
| 4,443,141 | 4/1984 | Kosmowski | 409/163 |
| 4,530,627 | 7/1985 | Kosmowski | 409/190 X |
| 4,822,219 | 4/1989 | Wood et al. | 408/67 X |
| 4,915,550 | 4/1990 | Arai et al. | 409/137 X |
| 4,917,547 | 4/1990 | Frederickson et al. | 408/98 X |
| 5,087,156 | 2/1992 | Kanaya et al. | 408/95 X |

FOREIGN PATENT DOCUMENTS

| | | | |
|---|---|---|---|
| 3733534 | 4/1989 | Fed. Rep. of Germany | 409/137 |
| 3734127 | 4/1989 | Fed. Rep. of Germany | 409/137 |
| 11077 | 3/1976 | Japan | |
| 78586 | 6/1980 | Japan | |
| 11509 | 1/1987 | Japan | |
| 0003713 | 1/1991 | Japan | 408/95 |

Primary Examiner—Steven C. Biship
Attorney, Agent, or Firm—Antonelli, Terry, Stout & Kraus

[57] ABSTRACT

The present invention relates to a printed circuit board presser device in a drilling machine. The board presser device is arranged such that it includes an axially movable upper-plate presser device which is provided on the outer side of a contact surface of the board presser device with a printed circuit board so that a top end surface of the upper-plate presser device extends to the side of a table beyond the contact surface; and an urging device for pushing the upper-plate presser device against the table by a force larger than an attraction force generated from the board presser device. With such construction, an upper plate is suppressed from floating during drilling the printed circuit board, and a distance of useless transfer movement of a drill decreased, to thereby improve an efficiency of a drilling operation.

7 Claims, 6 Drawing Sheets

PRINTED CIRCUIT BOARD PRESSER DEVICE IN DRILLING MACHINE

BACKGROUND OF THE INVENTION

The present invention relates to a printed circuit board presser device of a drilling machine, and more particularly, to a printed circuit board presser device which improves an efficiency of drilling operation.

A conventional printed circuit board drilling machine includes, for example, an arrangement such as illustrated in FIGS. 12 and 13.

In the drawings, reference numeral 1 denotes a printed circuit board (which will be simply referred to as a "board", hereinafter). Reference 2 is an upper plate superposed upon the board 1. Reference 3 is a lower plate which is located below the board 1. Reference 4 designates locating pins fixed through the upper plate 2, the board 1 and the lower plate 3 and extending outwardly from the lower plate 3. Reference numeral 5 is an adhesive tape for securing the peripheral side portions of the upper plate 2, the board 1 and the lower plate 3.

The upper plate 2, the board 1 and the lower plate 3 are integrally connected with each other by the pins 4 and the adhesive tape 5, and an assembly including these components will be hereinafter referred to as a work W.

Reference numeral 6 designates a table supported on a bed, which is not shown, so as to be movable forward and rearward perpendicular to a paper sheet of the drawings. There is provided on that table 6 fixture means (not shown) for locating and securing the pins 4. Reference 7 is a feeder screw which is rotatably retained on the bed and is driven to rotate by a motor (not illustrated), to thereby displace the table 6. Reference 8 indicates a slider supported on a column movably in the rightward and leftward directions in the drawings, the column being not shown. Reference 9 indicates a feeder screw which is rotatably supported on the column and driven for rotation to move the slider 8 by a motor 10. Reference 11 is a saddle retained by the slider 8 vertically movably in the planes of the drawings. Reference 12 denotes a feeder screw which is rotatably supported on the slider 8 and driven for rotation by a motor to move the saddle 11. Reference numeral 14 is a spindle unit for receiving a rotatable spindle (not shown) therein and secured on the saddle 11. Reference 15 shows a ring in which a shank portion of a drill 16 is press-fitted.

Reference numeral 17 indicates cylinders which are supported on the saddle 11 and which position at the locations on the right and left sides of the spindle unit 14. Reference numeral 18 is a board presser device slidably fitted on the spindle unit 14 and supported by the cylinders 17.

This board presser device 18 is formed at its lower center with a hole through which the drill 16 can pass. An annular press-contact portion 18a for holding the work W is provided on the periphery of the hole. The press-contact portion 18a is formed at its lower end surface with grooves 18b for sucking air during drilling operation. Also, there is provided on the side surface of the board presser device 18, an aperture 18c for discharging chips produced by the drilling operation.

Reference numeral 19 designates a chip collector, and reference 20 is a pipe which connects the aperture 18c of the board presser device 18 to the chip collector 19 to each other.

Compressed air of a predetermined pressure is delivered to the cylinders 17 in order to force the board presser device 18 downwardly while the chip collector 19 is operated, thus discharging air within a space defined between the spindle unit 14 and the board presser device 18.

In this state, the table 6 and the slider 8 are moved to adjust a setting position of the drill 16 to a position of the board 1 to be drilled. Then, the motor 13 is made to drive so as to lower the saddle 11 for carrying out a drilling operation. More particularly, when the saddle 11 starts to descend, at first, the press-contact portion 18a of the board presser device 18 is brought into contact with the upper plate 2. Successively, when the saddle 11 further descends, the board presser device 18 presses the work W against the table 6 by the pressure of the compressed air supplied to the cylinders 17. When the saddle 11 still further descends, the drill 16 is protruded from the board presser device 18 to conduct the drilling operation. Concurrently, the chips produced from the drilled portion are discharged to the chip collector 19, carrying on a flow of air sucked from the groove 18b of the board presser device 18.

SUMMARY OF THE INVENTION

In order to improve an operation efficiency of such printed circuit board drilling machine, when the drill 16 is lifted after the drilling operation, a distance between the upper plate 2 and the distal end of the drill 16 has to be made as small as possible and also the above-mentioned distance at the next drilling operation is made as small as possible, to thereby reduce the distance of non-drilling of the drill 16 at the initial stage of the subsequent drilling operation.

However, if the lifting distance of the drill 16 is reduced, the drill 16 is moved to the next drilling position while the upper plate 2 is attracted to the board presser device 18, as shown in FIG. 13.

In this case, because air which is sucked into the space P defined among the spindle unit 14, the board presser device 18 and the upper plate 2 flows through small holes formed between the grooves 18b of the board presser device 18 and the upper plate 2, the amount of the air is unfavorably decreased as shown by the broken line in FIG. 4 so that the chips cannot be removed sufficiently. Moreover, the temperature of the drill 16 which rises during the drilling operation cannot be cooled enough. Further, there occurs a problem in that the drill 16 is liable to be broken or that the quality of the drilled hole is deteriorated.

Under such condition, in the prior art, since the saddle 11 is lifted to the position where the upper plate 2 is separated from the board presser device 18 enough to discharge the chips and to cool the drill, the distance of non-drilling of the drill 16 is increased.

As the number of holes drilled in a single board 1 may be several ten thousands, even if a period of time requisite for drilling one hole is lengthened by 0.1 second, the period of time for completing the known drilling operation on the single board is consequently lengthened by several ten minutes.

Accordingly, it has been desired to reduce the distance of non-drilling of the drill 16 in order to enhance an efficiency of the drilling operation.

In view of the above-described conditions, an object of the present invention is to provide a printed circuit board presser device in a drilling machine in which an upper plate is prevented from being lifted, and an excessive transfer distance of a drill is shortened, to thereby improve an efficiency of a drilling operation.

To achieve the aforesaid object, according to the invention, the board presser device comprises: upper-plate presser means of which top end surface extends to the side of a table beyond a contact surface of the board presser device with a board, the upper-plate presser means being provided on the outside of the contact surface movably in the axial direction thereof; and urging means for pushing the upper-plate presser means toward the table by a force larger than an attraction force generated from the board presser device.

When the drill is lifted after the drilling operation, at first, the drill is separated from the upper plate, and then, the press-contact portion of the board presser device is moved apart from the upper plate. At this time, since the upper plate is retained by means of the upper-plate presser means, a distance of lift of the upper plate is reduced. As a result, the press-contact portion of the board presser device can be promptly separated from the upper plate.

In this case, because a flowing passage of air is enlarged, an amount of air flowing into the board presser device is increased and a current of the air to be fed into the chip collector becomes stronger, so that chips remaining on the upper plate or sticking to the drill can be favorably discharged and further a cooling efficiency of the drill can be enhanced. Therefore, the stroke distance and the distance of non-drilling of the drill are reduced, to thereby shorten a period of time required for the drilling operation.

As mentioned above, according to the invention, it is possible to improve an operation efficiency of drilling without deteriorating the quality of a hole to be drilled.

DESCRIPTION OF THE PREFERRED EMBODIMENTS

Figure 1:
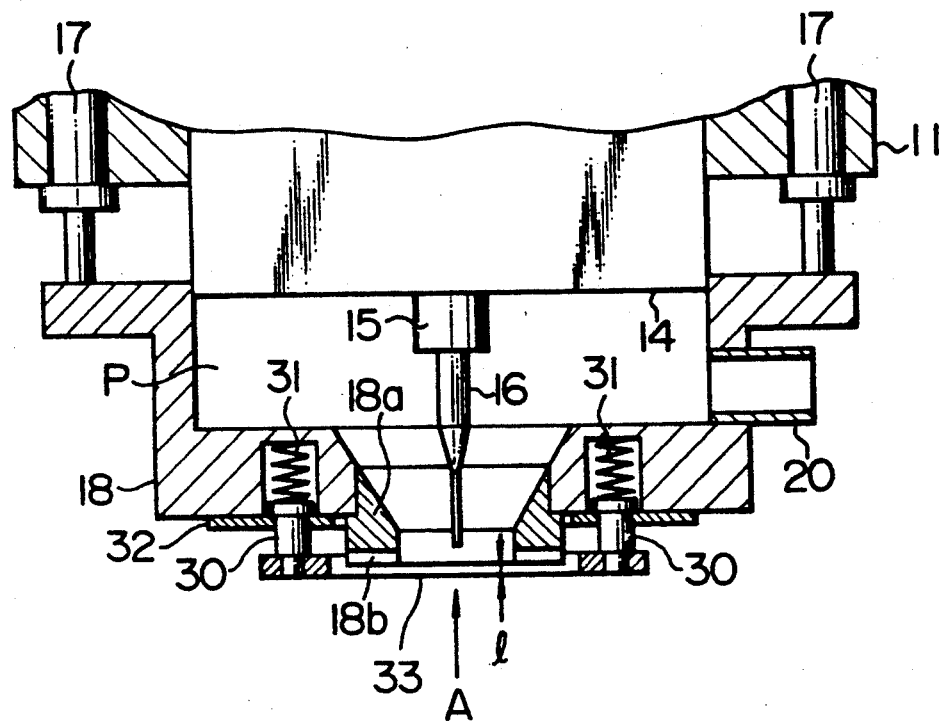
FIG. 1 is a longitudinally cross-sectional view of a printed circuit board presser device according to the invention.
Figure 2:
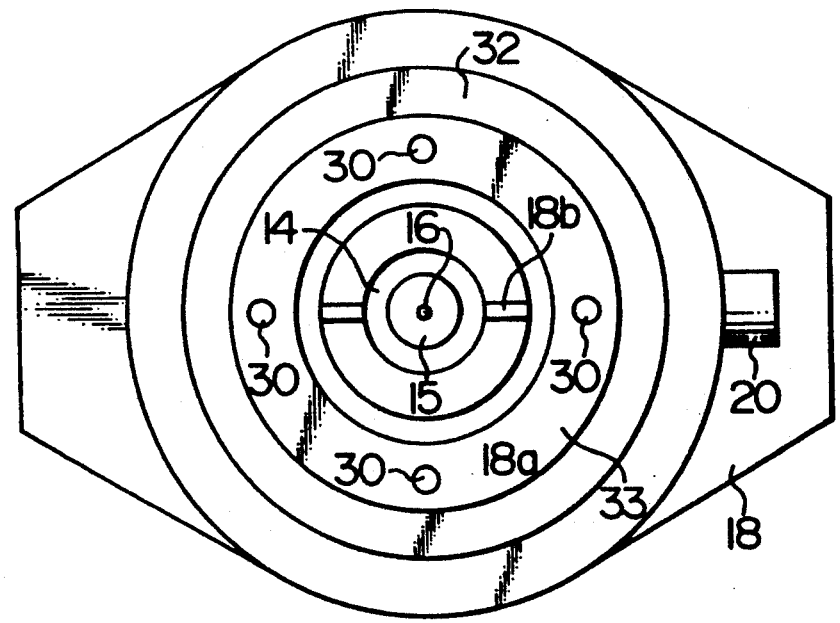
FIG. 2 is a bottom view of FIG. 1.
Figure 12:
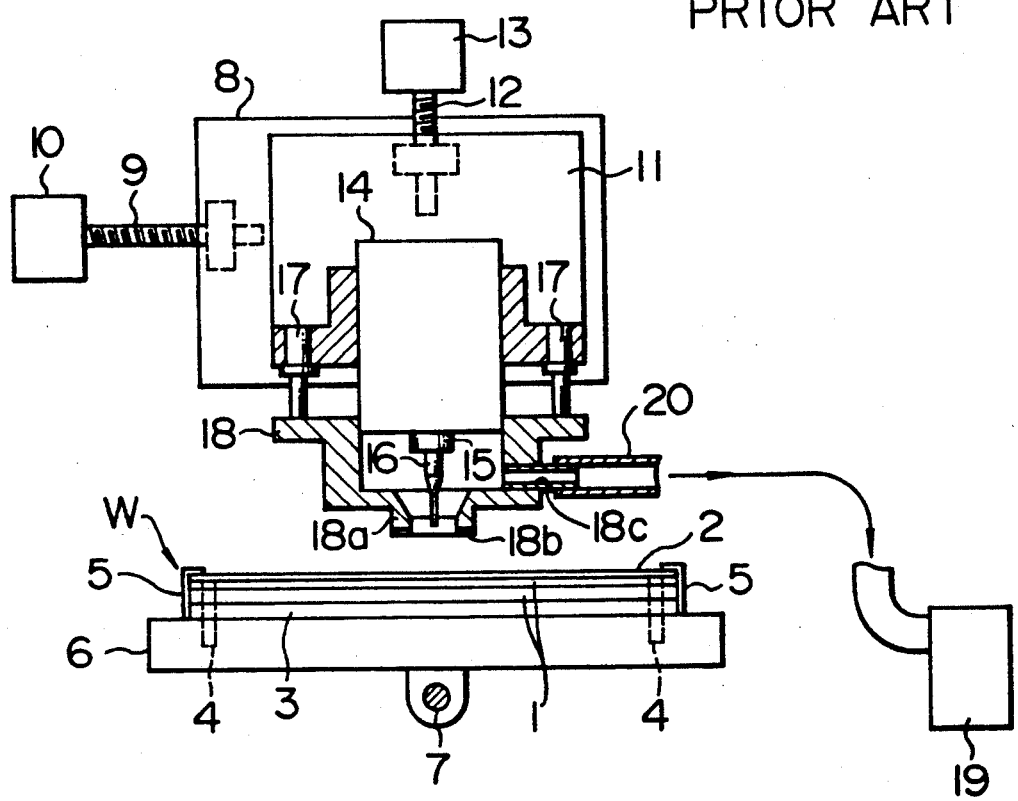
FIG. 12 is a view showing an arrangement of a main portion of a conventional printed circuit board drilling machine.
Figure 13:
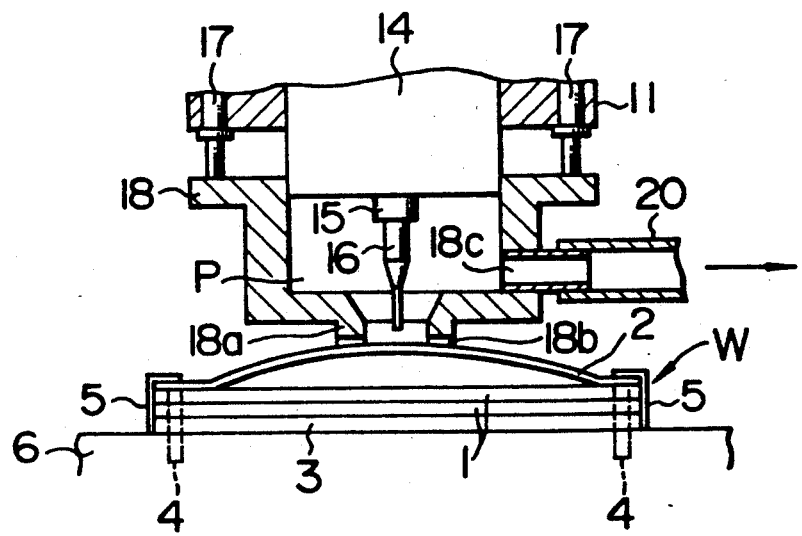
FIG. 13 is an elevational cross-sectional view of the printed circuit board drilling machine of FIG. 12 in the state of drilling.

In FIGS. 1 to 3, like reference numerals are referred by the same reference numerals as in FIGS. 12 and 13.

Reference numeral 30 designates guides which are retained in holes formed on the lower end surface of a printed circuit board presser device 18 movably in the axial direction of the guides and which are forcibly urged to project out of the holes by means of springs 31. Reference numeral 32 shows stoppers secured to the lower end surface of the board presser device 18, for preventing the guides 30 from springing out. Reference 33 is an upper-plate presser which is supported on the guides 30 in such a manner that the lower end surface of the upper-plate presser 33 is extended to the side of a table 6 from the lower end surface of a press-contact portion 18a by a length of 'l'.

Figure 3A:
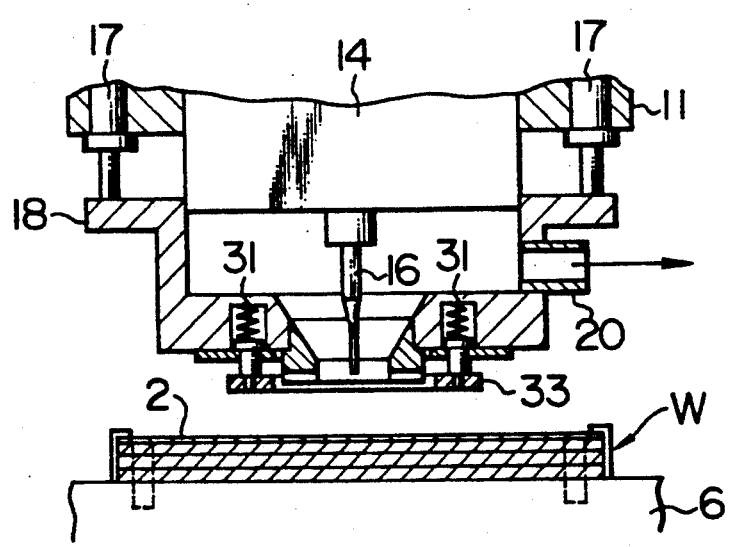
FIGS. 3A to 3C are views showing drilling processes that make use of the board presser device of the invention.

With such construction, a saddle 11 is lowered from a starting position of a drilling operation as shown in FIG. 3A.

Then, the board presser device 18 descends to bring the upper-plate presser 33 into contact with an upper plate 2 of a work W mounted on and secured to the table 6.

Subsequently, when the saddle 11 descends, because the upper-plate presser 33 is prevented from movement by the work W, the springs 31 are compressed by the saddle so that the work W is forced and sustained from the upper side of the upper plate 2 owing to a counter force of the springs 31 against the compressing pressure.

When the saddle 11 is further lowered, the press-contact portion 18a of the board presser device 18 abuts against the upper plate 2 of the work W.

After this, when the saddle 11 is still further lowered, since the board presser device 18 is also held without movement by the work W, the pistons of the cylinders 17 are returned back to the initial positions in the cylinders 17 so that the board presser device 18 holds the work W by applying the pressure of the compressed air delivered into the cylinders 17.

Figure 3B:
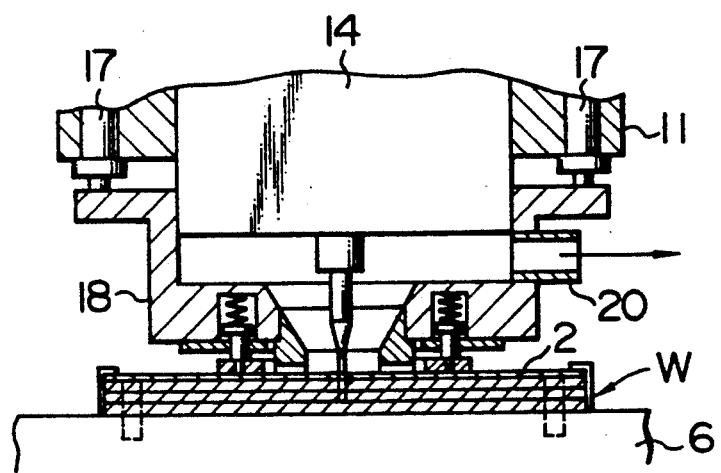

Then, when the saddle 11 continues to descend, a spindle unit 14 is lowered to drill the material of the work W by the drill 16, as shown in FIG. 3B.

After the drilling operation is completed, the saddle 11 begins to rise.

Successively, at first, the spindle unit 14 is lifted together with the saddle 11.

At this time, the board presser device 18 presses the work W by the pressure of the compressed air supplied to the cylinders 17, until the pistons which support the board presser device 18 are lifted by the cylinders 17.

After that, when the pistons are lifted by the cylinders 17, the board presser device 18 starts to move upwardly.

The counter force of the springs 31 allows the upper-plate presser 33 to press the work W until the guides 30 are lifted by the stoppers 32. Accordingly, since the upper plate 2 which receives an attraction force resulted from suction of a chip collector is pressed by the upper-plate presser 33, the press-contact portion 18a of the board presser device 18 is separated from the upper plate 2 to define a gap of a distance 'l' between the press-contact portion 18a and the upper plate 2.

Because air is suctioned into the space P defined between the spindle unit 14 and the board presser device 18 from the environment of the press-contact portion 18a, the amount of the air flowing into the chip collector is increased so that an efficiency of discharging the chips or cooling the drill 16 can be enhanced.

Figure 3C:
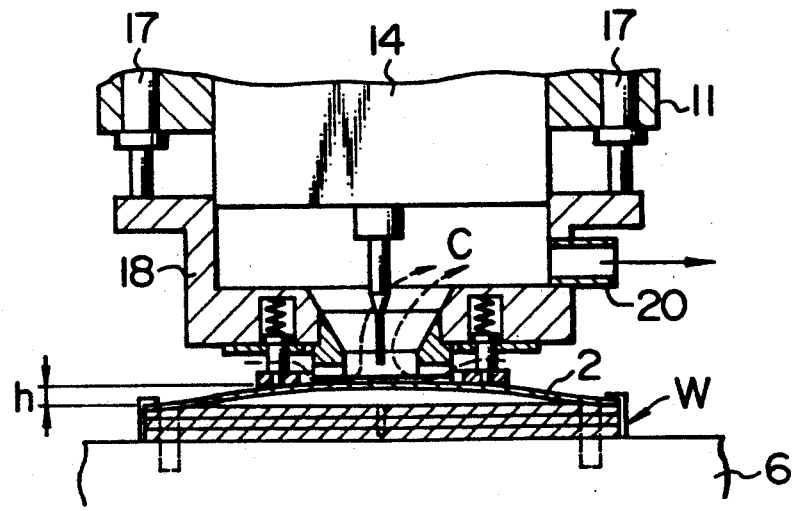

Further, when the board presser device 18 ascends, the upper-plate presser 33 is also lifted. Concurrently, even if a suction force of the chip collector is strong and the upper plate 2 is lifted by the suction force of the chip collector as shown in FIG. 3C, the upper plate 2 is pressed by the upper-plate presser 33 and i not in contact with the press-contact portion 18a so that a passage of air can be obtained.

Figure 4:
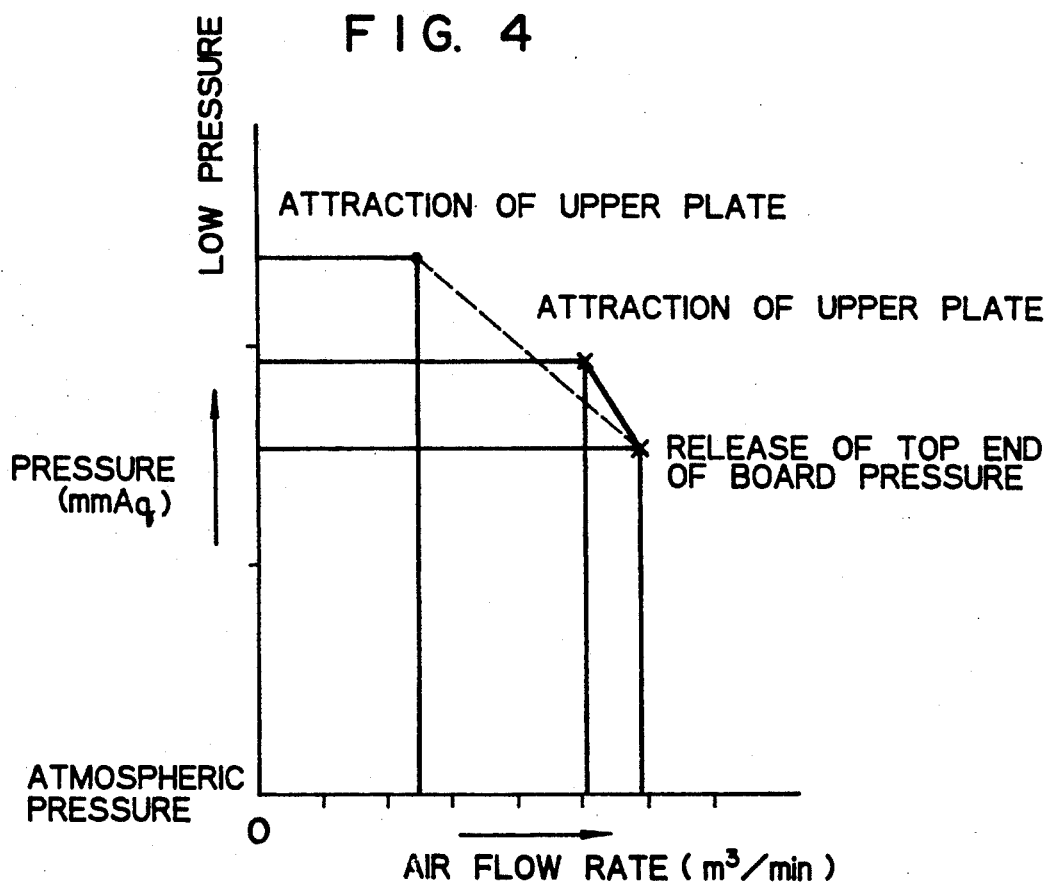
FIG. 4 is a characteristic graph illustrating a relation between a pressure and flow rate of air to be sucked into a chip collector.

From a result of measuring a pressure and flow rate of air flowing through a pipe 20 connecting the board presser device 18 and the chip collector while the board presser device 18 is being lifted to the position where the press-contact portion 18a thereof releases the upper plate 2 from being attracted thereto, as shown by the solid line in FIG. 4, it is understood that the pressure is raised and the flow rate is increased twice as compared with the conventional board presser device.

Thus, it is possible to improve an efficiency of discharging the chips and cooling the drill by increasing the flow rate of the air, and eventually to heighten the quality control of the drilled hole.

In the case where the saddle 11 is lifted to the position where the press-contact portion 18a of the board presser device 18 is released from the upper plate 2, provision cf the upper-plate presser 33 reduces a distance of displacement of the saddle 11. More specifically, when the drill 16 is moved upwardly after drilling, a distance between the upper plate 2 and the distal end portion of the drill 16 is reduced so that the distance of non-drilling of the drill 16 at the initial stage of the subsequent drilling operation is minimized, thereby enhancing the efficiency of the drilling operation.

Figure 5:
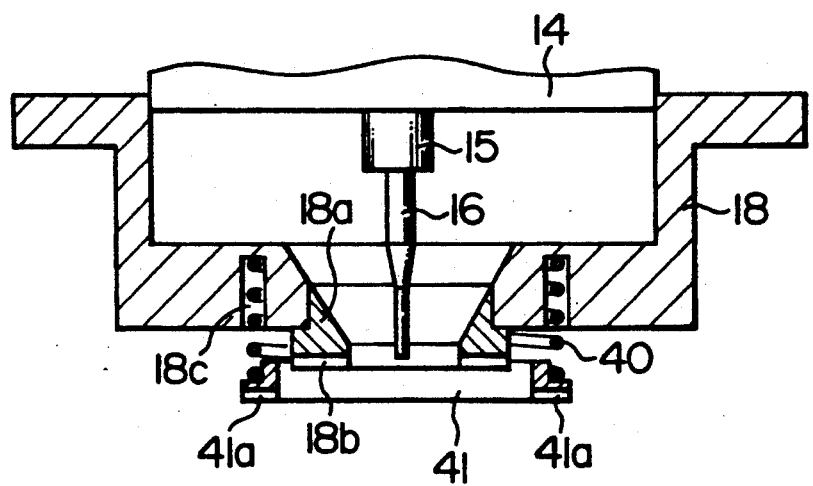
FIG. 5 is an elevational cross-sectional view of a main portion of a board presser device illustrative of a second embodiment of the invention.

FIG. 5 shows a second embodiment of the present invention.

In the figure, like reference numerals are referenced by the same reference numbers as in FIGS. 1 to 3.

Reference numeral 40 designates a spring which is securely fitted in an annular groove 18c formed in a printed circuit board presser device 18 at the one end of the spring.

Reference 41 is an upper-plate presser secured to a free end of the spring 40 in such a manner that a contact surface with an upper plate of the board is projected beyond a lower end surface of a press-contact portion 18a to the side of a table. Reference 41a shows a groove provided on the contact surface of the upper-plate presser 41.

Also with such construction, a similar effect as the aforesaid embodiment can be obtained.

In the respective embodiments mentioned above, the groove is formed in the upper or contact surface of the upper-plate presser 33 or 41, whereby the flow rate of air at the outer periphery of the press-contact portion 18a can be increased.

Figure 6:
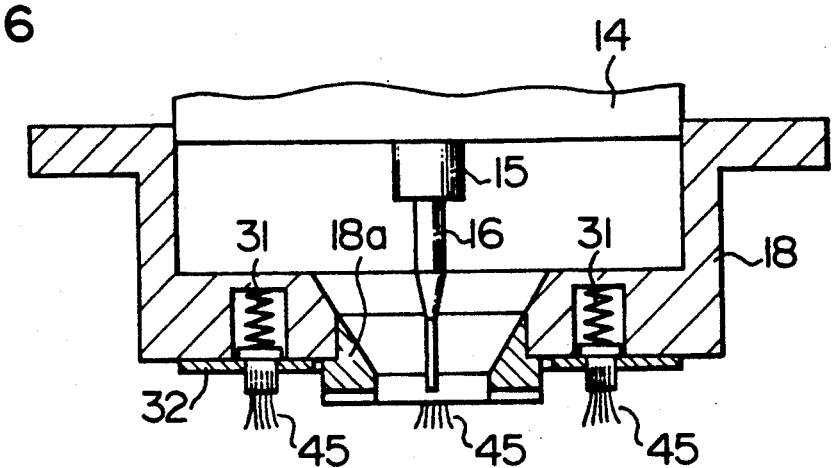
FIG. 6 is an elevational cross-sectional view of a main portion of a board presser device illustrative of a third embodiment of the invention.

FIG. 6 illustrates a third embodiment of the invention.

In the figure, like reference numerals are appended to like members as in FIGS. 1 to 3.

Reference numeral 45 indicates brushes acting as an upper-plate presser, the brushes being axially movably supported in holes formed in the lower end surface of a printed circuit board presser device 18. The brushes 45 are urged to protrude out of the holes by means of springs 31 so as to be press-engaged with stoppers 32. Distal ends of these brushes 45 are arranged to extend beyond the lower surface of a press-contact portion 18a toward the table side.

Also with that construction, a similar effect as the aforesaid embodiments can be obtained.

Figure 7:
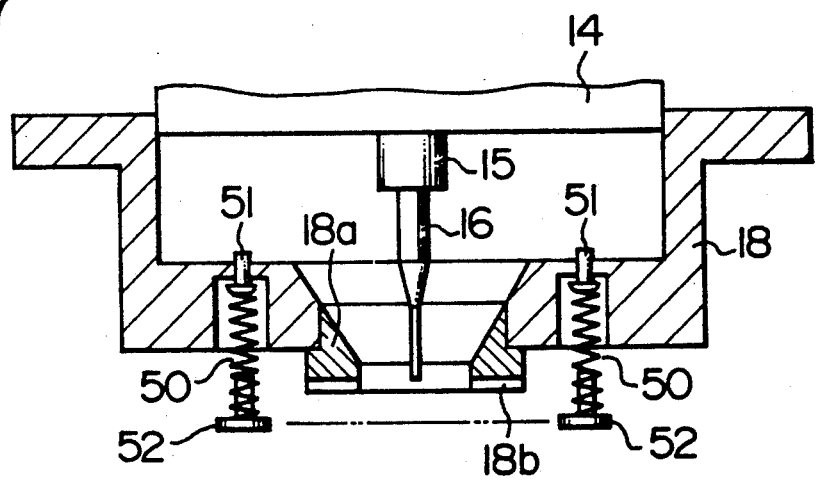
FIG. 7 is an elevational cross-sectional view of a main portion of a board presser device illustrating a fourth embodiment of the invention.
Figure 8:
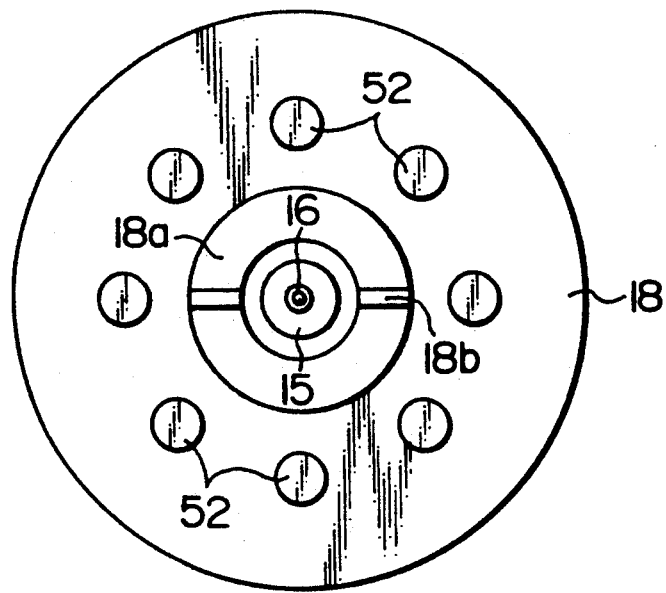
FIG. 8 is a bottom view of FIG. 7.
Figure 9:
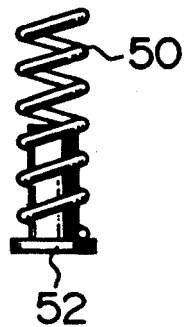
FIG. 9 is an enlarged view of a pin.

FIGS. 7 to 9 indicate a fourth embodiment of the invention.

In the figures, like reference numerals are referenced to the same reference numbers as in FIGS. 1 to 3.

Reference numerals 50 are springs whose one ends are inserted in holes formed in the lower end surface of a printed circuit board presser device 18 and secured thereto by means of threads 51. References 52 denote pins operating as an upper-plate presser which are inserted in and secured to free ends of the springs 50. The lower end portions of the pins 52 are formed in such a manner that diameters thereof are larger than those of holes to be formed in a printed circuit board.

With such construction, a similar effect as the respective aforesaid embodiments can be achieved.

Figure 10:
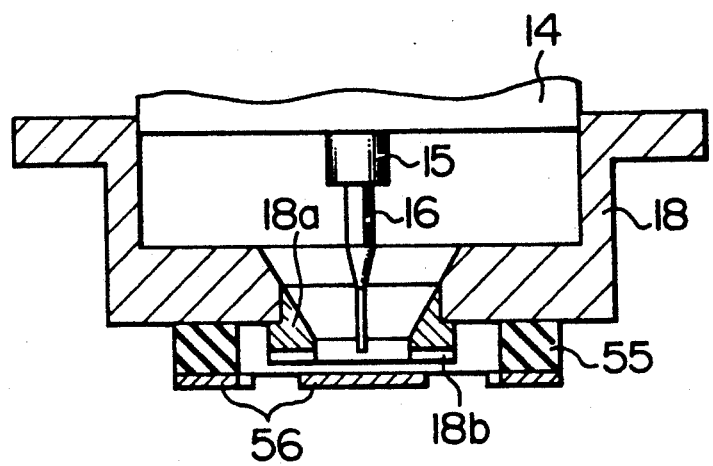
FIG. 10 is an elevational cross-sectional view of a main portion of a board presser device illustrative of a fifth embodiment of the invention.
Figure 11:
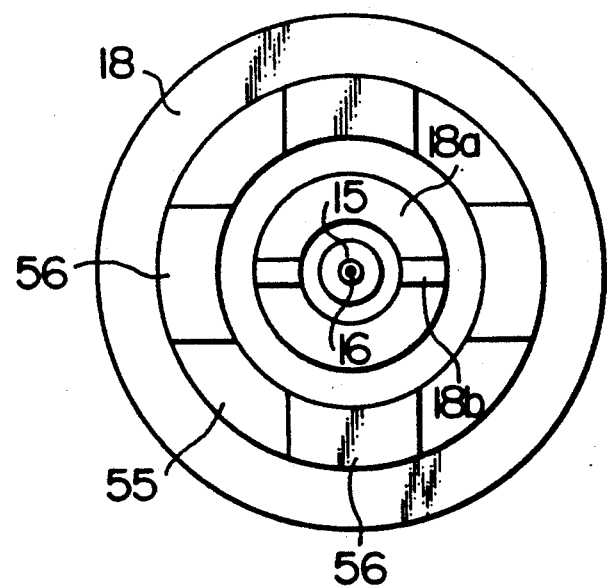
FIG. 11 is a bottom view of FIG. 10.

FIGS. 10 and 11 are illustrative of a fifth embodiment of the invention.

In the figures, like references are given to referenced to the same reference numbers as in FIGS. 1 to 3.

Reference numeral 55 shows a ring of rubber adhered to a board presser device 18. Reference numerals 56 are frictional contact elements which act as an upper-plate presser and which are adhered to the ring 55.

With such construction, a similar effect as the respective aforesaid embodiments can be obtained.

Additionally, if the upper-plate pressers 33, 41, the pins 52, and the frictional contact elements 56 in the above embodiments are formed of, for example, polyacetal resin or the like, friction between them and the upper plate is minimized so that they can be moved while being in contact with the upper plate. Further, the upper-plate pressers 33, 41, the pins 52, and the frictional contact elements 56 may be formed of another material and the contact surfaces thereof with the upper plate may be coated with a layer of tetrafluoroethylene or the like.

We claim:

1. A printed circuit board presser device for use with a drilling machine, said printed circuit presser device being suspendedly supported on a saddle of the drilling machine by cylinders such that said saddle is slidably fitted on a spindle unit and adapted to communicate with a chip collector, to thereby hold a printed circuit board against a table during a drilling operation, said printed circuit board presser device comprising:

an axially movable upper-plate presser means provided on an outer side of a contact surface of the printed circuit board presser device with the printed circuit board so that a top end surface of the upper-plate presser means extends beyond said contact surface to a side of a table; and urging means for pressing said upper-plate presser means against the table by a force larger than an attraction force generated by the printed circuit board presser device.

2. A printed circuit board presser device for use with a drilling machine according to claim 1, wherein said upper-plate presser means is formed with a ring of synthetic resin, and said urging means comprises a plurality of coil springs.

3. A printed circuit board presser device for use with a drilling machine according to claim 2, wherein said printed circuit board presser device further comprises a plurality of grooves provided on an upper surface of the ring.

4. A printed circuit board presser device for use with a drilling machine according to claim 2, wherein said printed circuit board presser device further comprises a plurality of grooves formed on a lower surface of the ring.

5. A printed circuit board presser device for use with a drilling machine according to claim 1, wherein said upper-plate presser means comprises a plurality of pins formed at intervals and having contact surfaces contacting the printed circuit board, said pins being larger in diameter than drilled holes in the printed board, and wherein said urging means are formed with a plurality of coil springs corresponding to said pins in number.

6. A printed circuit board presser device for use with a drilling machine according to claim 1, wherein said upper-plate presser means comprises a plurality of brushes formed at intervals, and wherein said urging means are formed with a plurality of coil springs corresponding to said brushes in number.

7. A printed circuit board presser device for use with a drilling machine according to claim 1, wherein said urging means is an annular-shaped rubber member, and wherein said upper-plate presser means comprises a plurality of frictional contact elements provided on an end surface of said urging means at intervals.

* * * * *